United States Patent
Sun et al.

(10) Patent No.: US 9,735,182 B2
(45) Date of Patent: Aug. 15, 2017

(54) ARRAY SUBSTRATE, DISPLAY DEVICE, AND METHOD FOR MANUFACTURING THE ARRAY SUBSTRATE

(71) Applicants: BOE Technology Group Co., Ltd., Beijing (CN); Ordos Yuansheng Optoelectronics Co., Ltd., Ordos, Inner Mongolia (CN)

(72) Inventors: Jian Sun, Beijing (CN); Cheng Li, Beijing (CN); Seongjun An, Beijing (CN); Bongyeol Ryu, Beijing (CN)

(73) Assignees: BOE Technology Group Co., Ltd., Beijing (CN); Ordos Yuansheng Optoelectronics Co., Ltd., Ordos, Inner Mongolia (CN)

( * ) Notice: Subject to any disclaimer, the term of this patent is extended or adjusted under 35 U.S.C. 154(b) by 0 days.

(21) Appl. No.: 15/372,228

(22) Filed: Dec. 7, 2016

(65) Prior Publication Data

US 2017/0092658 A1 Mar. 30, 2017

Related U.S. Application Data

(62) Division of application No. 14/360,541, filed as application No. PCT/CN2013/089787 on Dec. 18, 2013, now Pat. No. 9,559,125.

(30) Foreign Application Priority Data

Jul. 12, 2013 (CN) .......................... 2013 1 0294094

(51) Int. Cl.
*H01L 27/12* (2006.01)
*H01L 29/786* (2006.01)
(Continued)

(52) U.S. Cl.
CPC ........ *H01L 27/124* (2013.01); *H01L 27/1248* (2013.01); *H01L 27/1288* (2013.01);
(Continued)

(58) Field of Classification Search
CPC ............... G02F 1/136209; H01L 27/12; H01L 29/78633; H01L 29/78645; H01L 29/78648
(Continued)

(56) References Cited

U.S. PATENT DOCUMENTS 6,567,136 B1 * 5/2003 Sakuramoto ...... G02F 1/136209
349/110
2005/0045881 A1 3/2005 Nakamura
(Continued)

FOREIGN PATENT DOCUMENTS

CN 1870284 A 11/2006
CN 101083261 A 12/2007
(Continued)

OTHER PUBLICATIONS

Notification of the First Office Action from the Chinese Patent Office for the priority application 201310294094.3 dated Apr. 14, 2015 with English translation.

*Primary Examiner* — Edward Chin
(74) *Attorney, Agent, or Firm* — Haug Partners LLP

(57) ABSTRACT

An array substrate includes a substrate and data lines and scan lines arranged on the substrate. The data lines and the scan lines define plural pixel regions. A thin film transistor is arranged in each pixel region and includes a gate electrode, a source electrode, a drain electrode, and an active region. The gate electrode is arranged above the active region. The source electrode and the drain electrode are arranged at two opposite sides of the active region respectively. A light shielding metal layer is further arranged in
(Continued)

each pixel region. The light shielding metal layer and the data lines are arranged in the same layer on the substrate. The light shielding metal layer is arranged under the active region and at least partially overlaps with the active region. The data line is close to the source electrode and does not overlap with the active region at least partially.

7 Claims, 8 Drawing Sheets

(51) Int. Cl.
  *H01L 29/417* (2006.01)
  *H01L 29/66* (2006.01)
(52) U.S. Cl.
  CPC .. *H01L 29/41733* (2013.01); *H01L 29/78621* (2013.01); *H01L 29/78633* (2013.01); *H01L 29/66757* (2013.01); *H01L 29/78675* (2013.01)

(58) Field of Classification Search
  USPC ...... 257/E33.003, E33.004, 59, 72; 349/110, 349/111, 43
  See application file for complete search history.

(56) References Cited

U.S. PATENT DOCUMENTS

2011/0284851 A1* 11/2011 Liu .................. H01L 27/12
                                                          257/59
2011/0309397 A1    12/2011 Cheng et al.

FOREIGN PATENT DOCUMENTS

| CN | 101097381 A | 1/2008 |
| CN | 101123257 A | 2/2008 |
| CN | 101441372 A | 5/2009 |
| CN | 103383946 A | 11/2013 |
| CN | 203422543 U | 2/2014 |

* cited by examiner

ARRAY SUBSTRATE, DISPLAY DEVICE, AND METHOD FOR MANUFACTURING THE ARRAY SUBSTRATE

This application is a Division of application Ser. No. 14/360,541 filed May 23, 2014, which is a 371 of PCT/CN2013/089787 filed on Dec. 18, 2013, which claims priority benefits from Chinese Patent Application Number 201310294094.3 filed Jul. 12, 2013, the disclosure of which is incorporated herein by reference.

FIELD OF THE INVENTION

The present invention relates to the field of display technology, in particular, relates to an array substrate, a display device, and a method for manufacturing the array substrate.

BACKGROUND OF THE INVENTION

A liquid crystal display (LCD) has become a mainstream product among the current flat panel display devices due to its characteristics of small size, low power consumption, no radiation, etc.

Currently, a more common liquid crystal display is a liquid crystal display of twisted nematic (TN) display mode. With the development of display technology, a liquid crystal display of advanced super dimension switch (ADS) display mode also appears. Nowadays, a thin film transistor-liquid crystal display (TFT-LCD) is more mature technically. A liquid crystal display includes an array substrate and a color-filter substrate, wherein thin film transistors are formed on the array substrate, each of the thin film transistors includes a gate electrode, a source electrode and a drain electrode, and is commonly formed of an amorphous silicon (a-Si) material.

With the development of display technology, a manner in which a thin film transistor is formed of a polysilicon (p-Si) material appears. Specifically, an active region is formed first by using a polysilicon (p-Si) material, then crystallization and ion implantation are performed on the active region, thus a source electrode and a drain electrode of the thin film transistor are formed. Researches have disclosed that the performance of a thin film transistor formed of a polysilicon (p-Si) material is higher than that of a thin film transistor formed of an amorphous silicon material by more than 100 times. A polysilicon includes a high-temperature polysilicon and a low-temperature polysilicon. A thin film transistor formed of a low-temperature polysilicon not only has a high electron mobility but also can has a reduced size. Thus, the thin film transistor formed of a low-temperature polysilicon is widely used in an array substrate, thereby not only a high aperture ratio is realized but also the corresponding display device has advantages of high brightness and low power consumption.

Compared with a thin film transistor formed of an amorphous silicon material, a thin film transistor formed of a low-temperature polysilicon has a larger leakage current when it operates. Thus, in order to reduce the leakage current, as shown by a schematic diagram of the structure of the array substrate in FIG. 1, light shielding metal layers 3 are disposed such that they are on the array substrate 1 and under the active region 4 corresponding to the thin film transistor. The light shielding metal layers 3 shield a part of light which irradiates to an area between a drain electrode 7 and a source electrode 6, thus the leakage current is reduced. Alternatively, the leakage current can be reduced to some extent by arranging a lightly doped drain 8 in the active region 4 with an ion implantation method (also known as an ion doping method) during forming the drain electrode 7 and the source electrode 6, by configuring the thin film transistor to have a double-gate structure (e.g. to have two gate electrodes 5 as shown in FIG. 1), or by other ways.

Compared with the array substrate comprising the thin film transistors formed of amorphous silicon material, the array substrate comprising the thin film transistors formed of polysilicon material requires a plurality of patterning processes when being manufactured. As shown in the diagrams of manufacturing steps (steps P1-P10) for the array substrate in FIGS. 2a to 2j, in order to form the light shielding metal layer 3 for reducing the leakage current of the thin film transistor, a patterning process including an exposure process (e.g., the step P1) for the light shielding metal layer 3 must be added when the array substrate is manufactured. The patterning process including an exposure process for the light shielding metal layer 3 together with the patterning processes of other layers during manufacturing the array substrate cause the number of patterning processes of a method for manufacturing the array substrate with a polysilicon material to increase, cause the manufacturing processes of the corresponding array substrate to be complex and numerous, and cause the manufacturing efficiency of the corresponding array substrate to be low. Said patterning processes of other layers during manufacturing the array substrate include, for example, a patterning process for manufacturing a data line 2 (e.g., the step P6), a patterning process for manufacturing a common electrode 12 (e.g., the step P8), a patterning process for manufacturing a pixel electrode 14 (e.g., the step P10), a patterning process for manufacturing a first via 15 which forms the electrical connection between the data line 2 and the source electrode 6 in a gate insulating layer 10 and an intermediate dielectric layer 11 (e.g., the step P5), a patterning process for manufacturing a third via 17 which forms the electrical connection between the pixel electrode 14 and the drain electrode 7 in the gate insulating layer 10 and the intermediate dielectric layer 11, a patterning process for manufacturing a fourth via 18 in a passivation layer 13, and a patterning process for manufacturing a fifth via 19 in a flat layer 20 (as shown in steps P5, P7 and P9, wherein the data line 2 and the common electrode 12 must be insulated from each other while the data line 2 and the common electrode 12 overlap or intercross in an orthogonal projection direction, thus the flat layer 20 playing an insulating role therebetween is necessary; correspondingly, the patterning process for forming the fifth via 19 which forms the electrical connection between the pixel electrode 14 and the drain electrode 7 in the flat layer 20 is necessary). A patterning process for manufacturing a buffer layer 9 and the active region 4 (step P2) as shown in FIG. 2b, a patterning process for manufacturing the gate insulating layer 10 and the gate electrodes 5 (step P3) as shown in FIG. 2c, a patterning process for manufacturing the source electrode 6, the drain electrode 7, and the lightly doped drain 8 (step P4) as shown in FIG. 2d, and the like are the same as the corresponding patterning processes described in detail below. The same reference number denotes the same element throughout the present description.

SUMMARY OF THE INVENTION

In view of the above technical problem existing in the prior art, the present invention provides an array substrate, a display device, and a method for manufacturing the array substrate, which can reduce the number of patterning processes of the array substrate and improve the manufacturing efficiency of the array substrate by forming a light shielding metal layer and a data line in the same layer on a substrate in a single step.

The array substrate includes a substrate and data lines and scan lines arranged on the substrate, the data lines and the scan lines define a plurality of pixel regions, a thin film transistor is arranged in each of the plurality of pixel regions, the thin film transistor includes a gate electrode, a source electrode, a drain electrode, and an active region, the gate electrode is arranged above the active region, the source electrode and the drain electrode are arranged at two opposite sides of the active region respectively, a light shielding metal layer is further arranged in each of the plurality of pixel regions, the light shielding metal layer and the data lines are arranged in the same layer on the substrate, the light shielding metal layer is arranged under the active region and at least partially overlaps with the active region in a projection direction, the data line is close to the source electrode and does not overlap with the active region at least partially in the projection direction.

For example, the light shielding metal layer and the data lines are formed of a same electrically conductive material.

For example, the active region is formed of a low-temperature polysilicon material, the source electrode and the drain electrode are formed at the two opposite sides of the active region respectively by way of ion implantation.

For example, the light shielding metal layer is arranged between areas corresponding to the source electrode and the drain electrode, and at least partially overlaps with the gate electrode in the projection direction.

For example, lightly toped drains are further arranged in the active region, the lightly toped drains are arranged between the source electrode and the drain electrode and are respectively arranged at two sides of a region corresponding to the gate electrode.

For example, the array substrate further includes a buffer layer arranged under the active region and on the substrate, the light shielding metal layer and the data lines are covered by the buffer layer.

For example, a position where the light shielding metal layer is arranged corresponds to a position of the gate electrode.

For example, the array substrate further includes a gate insulating layer arranged on the active region and under the gate electrode, the active region and the buffer layer are covered by the gate insulating layer.

For example, the array substrate further includes an intermediate dielectric layer, a first electrode, a passivation layer, and a second electrode which are arranged above the gate electrode in this order, the second electrode at least partially overlaps with the first electrode in the projection direction, the first electrode is of plate shape or slit shape, the second electrode is of slit shape;

the buffer layer, the gate insulating layer, and the intermediate dielectric layer are provided with a first via at a position corresponding to the data line, the gate insulating layer and the intermediate dielectric layer are provided with a second via at a position corresponding to the source electrode, the data line and the source electrode are electrically connected via the first via and the second via.

For example, the first electrode is a pixel electrode, the second electrode is a common electrode, the gate insulating layer and the intermediate dielectric layer are provided with a third via at a position corresponding to the drain electrode, the pixel electrode and the drain electrode are electrically connected via the third via; or the first electrode is a common electrode, the second electrode is a pixel electrode, the gate insulating layer and the intermediate dielectric layer are provided with a third via at a position corresponding to the drain electrode, the passivation layer is provided with a fourth via at a position corresponding to the drain electrode, the pixel electrode and the drain electrode are electrically connected via the third via and the fourth via.

For example, the array substrate further includes a pixel electrode arranged on the gate insulating layer, the gate insulating layer is provided with a third via at a position corresponding to the drain electrode, the pixel electrode and the drain electrode are electrically connected via the third via; and the gate insulating layer and the buffer layer are provided with a first via at a position corresponding to the data line, the gate insulating layer is provided with a second via at a position corresponding to the source electrode, the data line and the source electrode are electrically connected via the first via and the second via.

The present invention further provides a display device including the array substrate as described above.

The present invention further provides a method for manufacturing an array substrate including a step of forming data lines, scan lines, and a light shielding metal layer on a substrate and a step of forming thin film transistors on the substrate, forming the thin film transistor includes a step of forming a gate electrode, a source electrode, a drain electrode, and an active region, both the thin film transistors and the light shielding metal layer are formed in a plurality of pixel regions defined by the scan lines and the data lines, the light shielding metal layer and the data lines are formed in the same layer on the substrate in a single step, the light shielding metal layer is formed under the active region and at least partially overlaps with the active region in a projection direction, the data line is close to the source electrode and does not overlap with the active region at least partially in the projection direction.

For example, the step of forming a data line, a scan line, and a light shielding metal layer on a substrate includes:

forming a pattern including the data lines and the light shielding metal layer simultaneously on the substrate by a single patterning process, the data lines and the light shielding metal layer being arranged apart;

the step of forming a thin film transistor includes:

forming a buffer layer and a pattern including the active region on the substrate on which the data lines and the light shielding metal layer are formed, the buffer layer covers the light shielding metal layer and the data lines, a pattern of the active region is formed on the buffer layer and at least partially overlaps with the light shielding metal layer in the project direction;

forming a gate insulating layer and a pattern including the gate electrode on the substrate, a pattern of the gate electrode is formed at a position on the gate insulating layer corresponding to a position of the light shielding metal layer; and forming the source electrode and the drain electrode on the substrate, the source electrode and the drain electrode are formed at two opposite sides of the active region by way of ion implantation.

For example, the method further includes a step of forming a pattern including a first electrode and a second electrode, the first electrode is a pixel electrode, the second electrode is a common electrode, the step of forming a pattern including a first electrode and a second electrode includes:

forming an intermediate dielectric layer and a pattern including a first via, a second via, and a third via on the substrate, wherein the first via is formed at a position corresponding to the data line and penetrates through the buffer layer, the gate insulating layer, and the intermediate dielectric layer, the second via is formed at a position corresponding to the source electrode and penetrates through the gate insulating layer and the intermediate dielectric layer, and the third via is formed at a position corresponding to the drain electrode and penetrates through the gate insulating layer and the intermediate dielectric layer;

forming a pattern including the pixel electrode on the substrate, a pattern of the pixel electrode is formed on the intermediate dielectric layer, the data line and the source electrode are electrically connected through the first via and the second via, the pixel electrode and the drain electrode are electrically connected through the third via; and forming the passivation layer and a pattern including the common electrode on the substrate, the passivation layer completely covers the pixel electrode, the pattern including the common electrode is formed on the passivation layer.

For example, the method further includes a step of forming a pattern including a first electrode and a second electrode, the first electrode is a common electrode, the second electrode is a pixel electrode, the step of forming a pattern including a first electrode and a second electrode includes:

forming an intermediate dielectric layer and a pattern including a first via, a second via, and a third via on the substrate, wherein the first via is formed at a position corresponding to the data line and penetrates through the buffer layer, the gate insulating layer, and the intermediate dielectric layer, the second via is formed at a position corresponding to the source electrode and penetrates through the gate insulating layer and the intermediate dielectric layer, and the third via is formed at a position corresponding to the drain electrode and penetrates through the gate insulating layer and the intermediate dielectric layer;

forming a pattern including the common electrode on the substrate, a pattern of the common electrode is formed on the intermediate dielectric layer, the data line and the source electrode are electrically connected through the first via and the second via, an electrically conductive material used to form the common electrode is also filled into the third via;

forming the passivation layer on the substrate and forming a pattern including a fourth via in the passivation layer, the fourth via is formed at a position corresponding to the drain electrode, and a position of the fourth via corresponds to a position of the third via; and forming a pattern including the pixel electrode on the substrate, so that the pixel electrode and the drain electrode are electrically connected via the third via and the fourth via.

For example, the method further includes a step of forming a pixel electrode;

forming a pattern including a first via, a second via, and a third via on the substrate, wherein the first via is formed at a position corresponding to the data line and penetrates through the buffer layer and the gate insulating layer, the second via is formed at a position corresponding to the source electrode and penetrates through the gate insulating layer, and the third via is formed at a position corresponding to the drain electrode and penetrates through the gate insulating layer; and forming a pattern including the pixel electrode on the substrate, a pattern of the pixel electrode is formed on the gate insulating layer, the data line and the source electrode are electrically connected through the first via and the second via, the pixel electrode and the drain electrode are electrically connected through the third via.

For example, the step of forming the source electrode and the drain electrode of the method further includes, forming lightly doped drains in the active region by way of ion implantation, the lightly doped drains are formed between the source electrode and the drain electrode and are respectively arranged at two sides of a region corresponding to the gate electrode.

For example, positions of the light shielding metal layers are arranged to correspond to positions of the gate electrodes respectively.

The advantageous effects of the present invention are as follow: in the array substrate according to the present invention, the light shielding metal layer and the data lines are formed in the same layer of the array substrate, and in the corresponding method for manufacturing the array substrate, the light shielding metal layer and the data lines are formed by a single patterning process; compared with the existing method for manufacturing an array substrate, a separate patterning process for data lines is omitted, at the same time, formation of a flat layer which must be included in the prior art and a process for providing a via in the flat layer are not necessary; thus, the total number of patterning processes in the method for manufacturing an array substrate is reduced and the manufacturing efficiencies of the array substrate and the display device are increased.

Wherein reference numbers are described below:

1. substrate; 2. data line; 3. light shielding metal layer; 4. active region; 5. gate electrode; 6. source electrode; 7. drain electrode; 8. lightly doped drain; 9. buffer layer; 10. gate insulating layer; 11. intermediate dielectric layer; 12. common electrode; 13. passivation layer; 14. pixel electrode; 15. first via; 16. second via; 17. third via; 18. fourth via; 19. fifth via; 20. flat layer.

DETAILED DESCRIPTION OF THE EMBODIMENTS

For better understanding of technical solutions of the present invention by a person skilled in the art, a array substrate, a display device, and a method for manufacturing the array substrate according to the present invention will be further described in detail with reference to the drawings and embodiments.

Embodiment 1

Figure 3:
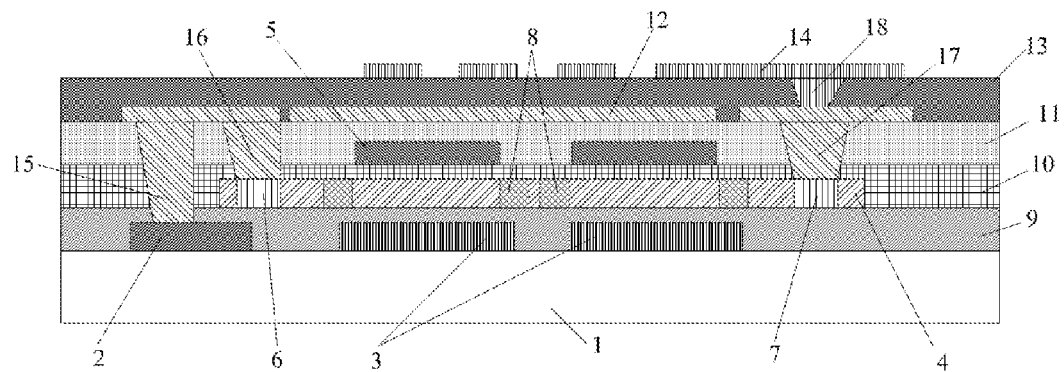
FIG. 3 is a schematic diagram showing the structure of an array substrate according to Embodiment 1 of the present invention.

The present embodiment provides an array substrate. As shown in FIG. 3, the array substrate includes a substrate 1 and data lines 2 and scan lines (not shown in FIG. 3) which are arranged on the substrate 1. The data lines 2 and the scan line define a plurality of pixel regions, and a thin film transistor is arranged in each of the plurality of pixel regions. The thin film transistor includes a gate electrode 5, a source electrode 6, a drain electrode 7, and an active region 4. The gate electrode 5 is arranged above the active region 4. The source electrode 6 and the drain electrode 7 are arranged at two opposite sides of the active region 4, respectively. A light shielding metal layer 3 is further arranged in each of the plurality of pixel regions. The light shielding metal layers 3 and the data lines 2 are arranged in the same layer on the substrate 1. The light shielding metal layer 3 is arranged under the active region 4 and at least partially overlaps with the active region 4 in an orthogonal projection direction (of course, the orthogonal projection direction herein just is a preferred embodiment; a projection direction can be a projection direction at other angles and is not limited hereto). The data line 2 is close to the source electrode 6 and does not overlap with the active region 4 at least partially in the orthogonal projection direction.

The light shielding metal layers 3 are arranged between areas corresponding to the source electrode 6 and the drain electrode 7, and at least partially overlap with the gate electrodes 5 respectively in a projection direction. The active region 4 is formed of a low-temperature polysilicon material. The source electrode 6 and the drain electrode 7 are formed at the two opposite sides of the active region 4 by way of ion implantation (e.g., ion implantation of a boron-containing material or a phosphorus-containing material).

In the present embodiment, the light shielding metal layer 3 partially overlaps with the active region 4, i.e., the light shielding metal layer 3 is arranged between the areas corresponding to the source electrode 6 and the drain electrode 7 so as to the light shielding metal layer 3 at least shields a part of the active region 4. Thus, a part of light irradiating to the active region 4 is shielded, and the leakage current of the active region 4 is reduced. Of course, the light shielding metal layer 3 may completely overlap with the active region 4, so that the light shielding metal layer 3 completely covers the active region 4. Thus, light irradiating to the active region 4 is shielded completely, and the leakage current of the active region 4 is further reduced.

The light shielding metal layer 3 and the data line 2 are formed of a same electrically conductive material, so that the light shielding metal layer 3 and the data line 2 arranged in the same layer may be formed simultaneously by a single patterning process. Furthermore, since the electrically conductive material is opaque, the light shielding metal layer 3 may shield a part of light irradiating to the active region 4 and reduce the leakage current of the thin film transistor.

In the present embodiment, for example, lightly toped drains 8 are further arranged in the active region 4. The lightly toped drains 8 are arranged between the source electrode 6 and the drain electrode 7, and are respectively arranged at two sides of a region corresponding to the gate electrode 5. In the present embodiment, the lightly toped drains 8 may also reduce the leakage current of the thin film transistor.

The number of the gate electrodes is at least one, and the number of the light shielding metal layers 3 is at least one. In the present embodiment, the number of the gate electrodes 5 is two, and the number of the light shielding metal layers 3 is two. The positions where the light shielding metal layers 3 are arranged correspond to the positions of the gate electrodes 5. In the present embodiment, the number of the gate electrodes 5 is set to be two, and the gate electrodes 5 can reduce the leakage current of the thin film transistor simultaneously. However, the present invention is not limited hereto, and the number of the gate electrodes and the number of the light shielding metal layers may be set as needed.

In the present embodiment, the array substrate further includes a buffer layer 9 arranged under the active region 4 and on the substrate 1. The light shielding metal layers 3 and the data line 2 are completely covered by the buffer layer 9. Since the active region 4 is formed of a low-temperature polysilicon material in the present embodiment, the buffer layer 9 is used to prevent an impurity contained in the substrate 1 from diffusing into the active region 4 of the thin film transistor and prevent an impact on characteristics of the thin film transistor such as a threshold voltage, a leakage current, and the like. At the same time, since low-temperature polysilicon is generally formed on the substrate 1 by a method of excimer laser annealing, the arrangement of the buffer layer 9 can further prevent excimer laser annealing from resulting in diffusion of am impurity contained in the substrate 1. Thus, the quality of a thin film transistor formed of low-temperature polysilicon is improved.

In the present embodiment, the array substrate further includes a gate insulating layer 10, as well as an intermediate dielectric layer 11, a first electrode, a passivation layer 13, and a second electrode which are arranged above the gate electrode 5 in this order. The gate insulating layer 10 is arranged on the active region 4 and under the gate electrode 5; the active region 4 and the buffer layer 9 are covered by the gate insulating layer 10; the second electrode at least partially overlaps with the first electrode in the orthogonal projection direction; the first electrode is of plate shape; and the second electrode is of slit shape. In addition, the buffer layer 9, the gate insulating layer 10, and the intermediate dielectric layer 11 are provided with a first via 15 at a position corresponding to the data line 2. The gate insulating layer 10 and the intermediate dielectric layer 11 are provided with a second via 16 at a position corresponding to the source electrode 6. The data line 2 and the source electrode 6 are electrically connected through the first via 15 and the second via 16.

In the present embodiment, the first electrode is a common electrode 12, and the second electrode is a pixel electrode 14. The gate insulating layer 10 and the intermediate dielectric layer 11 are provided with a third via 17 at a position corresponding to the drain electrode 7, and the passivation layer 13 is provided with a fourth via 18 at a position corresponding to the drain electrode 7. The pixel electrode 14 and the drain electrode 7 are electrically connected through the third via 17 and the fourth via 18.

It should be noted that, a flat layer may be further arranged between the intermediate dielectric layer 11 and the first electrode. The flat layer can make the intermediate dielectric layer remain flat. Of course, no flat layer may be arranged between the intermediate dielectric layer 11 and the first electrode. The present embodiment does not include a flat layer, which leads to a thinner array substrate. In the present embodiment, the first electrode is of plate shape. It should be understood that the first electrode can also be of slit shape.

As for the above array substrate, the present embodiment further provides a method for manufacturing the array substrate, which includes: a step of forming data lines, scan lines, and light shielding metal layers and a step of forming thin film transistors on a substrate. Forming the thin film transistor includes a step of forming a gate electrode, a source electrode, a drain electrode, and an active region. Both the thin film transistor and the light shielding metal layers are formed in a plurality of pixel regions defined by the scan lines and the data lines. The light shielding metal layers and the data lines are formed in the same layer on the substrate in a single step. The light shielding metal layers are formed under the active region and at least partially overlap with the active region in the orthogonal projection direction. A data line is close to the source electrode and does not overlap with the active region at least partially in the orthogonal projection direction.

Figure 4A:
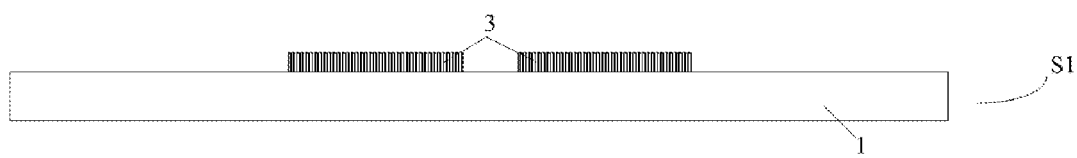
FIGS. 4a to 4h are schematic sectional views of the array substrate shown in FIG. 3 in respective steps when being manufactured.

As shown in FIGS. 4a to 4h, the method specifically includes the following steps:

the step of forming a data line, a scan line, and a light shielding metal layer on a substrate includes:

Step S1: as shown in FIG. 4a, forming a pattern including the data line (not shown in FIG. 4a) and the light shielding metal layers 3 simultaneously on the substrate 1 by a single patterning process, the data line and the light shielding metal layer 3 being arranged apart.

The patterning process may include only a photolithography process or include a photolithography process and an etching step, at the same time, may include other processes for forming a predetermined pattern such as printing, inkjet, and the like. The photolithography process refers to a process including processes such as film forming, exposure, development, and the like and for forming a pattern with a photoresist, a mask plate, an exposure machine, and the like. In the present embodiment, the patterning process includes the following steps: firstly, forming (e.g., sputtering, coating, or the like) a layer of electrically conductive material used to form the data line and the light shielding metal layers 3 on the substrate 1; next, coating a layer of photoresist on the electrically conductive material; then, exposing the photoresist with a mask plate provided with a pattern including the data line and the light shielding metal layers; lastly, forming the pattern including the data line and the light shielding metal layers 3 after developing and etching. In the method for manufacturing an array substrate according to the present embodiment, a manufacturing process relating to formation of a layer by a patterning process is the same as that described above, and detailed description thereof will be omitted hereinafter.

Figure 4B:
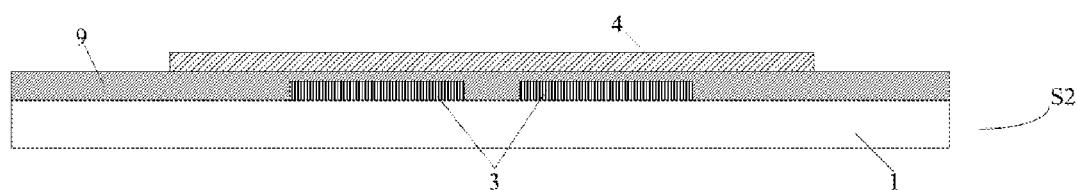

The step of forming a thin film transistor includes the following steps:

Step S2: as shown in FIG. 4b, forming a buffer layer 9 and a pattern including the active region 4 on the substrate 1 on which the step S1 is completed. The buffer layer 9 completely covers the light shielding metal layers 3 and the data line. A pattern of the active region 4 is formed on the buffer layer 9 and at least partially overlaps with the light shielding metal layers 3 in a project direction.

Figure 4C:
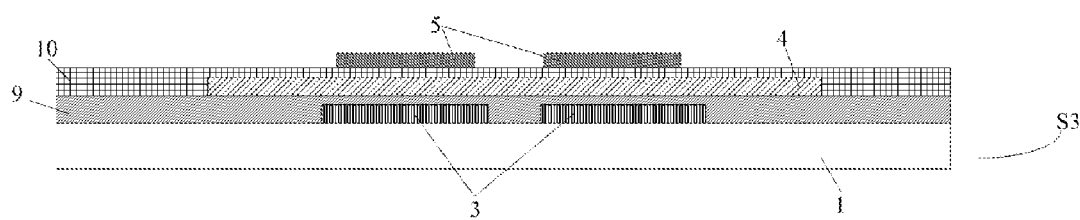

Step S3: as shown in FIG. 4c, forming a gate insulating layer 10 and a pattern including the gate electrodes 5 on the substrate 1 on which the step S2 is completed. Patterns of the gate electrodes 5 are respectively formed at positions on the gate insulating layer 10 corresponding to positions of the light shielding metal layers 3.

Figure 4D:
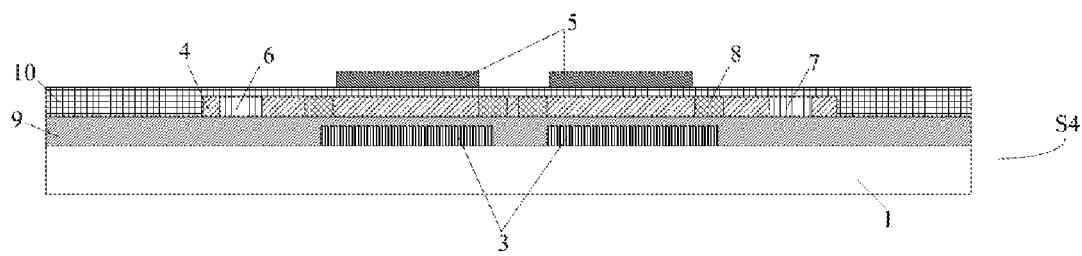

Step S4: as shown in FIG. 4d, forming the source electrode 6 and the drain electrode 7 on the substrate 1 on which the step S3 is completed. The source electrode 6 and the drain electrode 7 are formed at two opposite sides of the active region 4 by way of ion implantation.

Figure 4E:
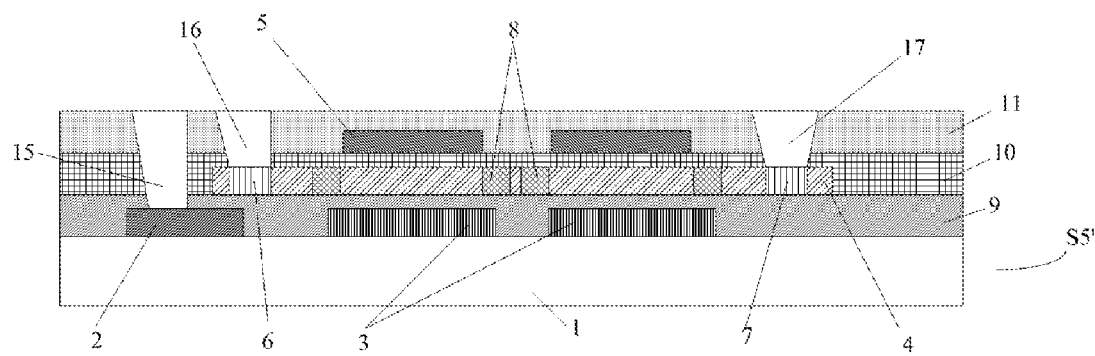

The method further includes a step of forming a pattern including a first electrode and a second electrode, wherein the first electrode is a common electrode, the second electrode is a pixel electrode, the step of forming a pattern including a first electrode and a second electrode includes the following steps:

Step S5': as shown in FIG. 4e, forming an intermediate dielectric layer 11 and a pattern including a first via 15, a second via 16, and a third via 17 on the substrate 1 on which the step S4 is completed. The first via 15 is formed at a position corresponding to the data line 2 and penetrates through the buffer layer 9, the gate insulating layer 10, and the intermediate dielectric layer 11; the second via 16 is formed at a position corresponding to the source electrode 6 and penetrates through the gate insulating layer 10 and the intermediate dielectric layer 11; and the third via 17 is formed at a position corresponding to the drain electrode 7 and penetrates through the gate insulating layer 10 and the intermediate dielectric layer 11.

Figure 4F:
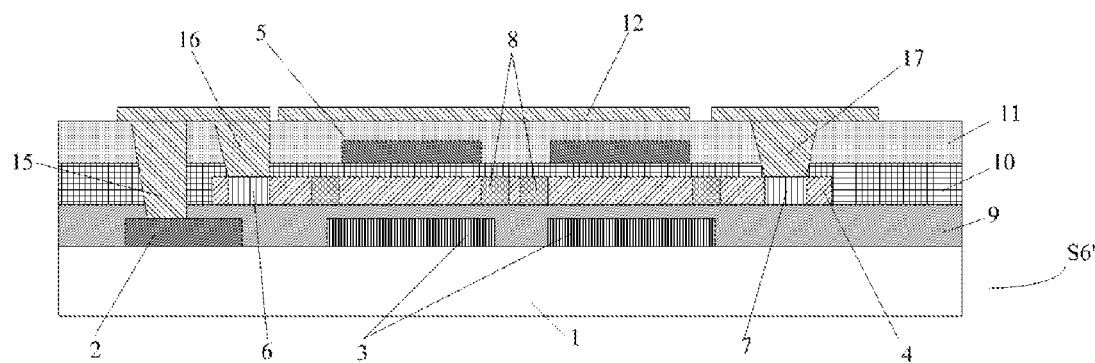

Step S6': as shown in FIG. 4f, forming a pattern including the common electrode 12 on the substrate 1 on which the step S5' is completed. The data line 2 and the source electrode 6 are electrically connected through the first via 15 and the second via 16. An electrically conductive material used to form the common electrode 12 is also filled into the third via 17. In the present step, electrical connection between the data line 2 and the source electrode 6 is realized while the pattern of the common electrode 12 is formed.

Figure 4G:
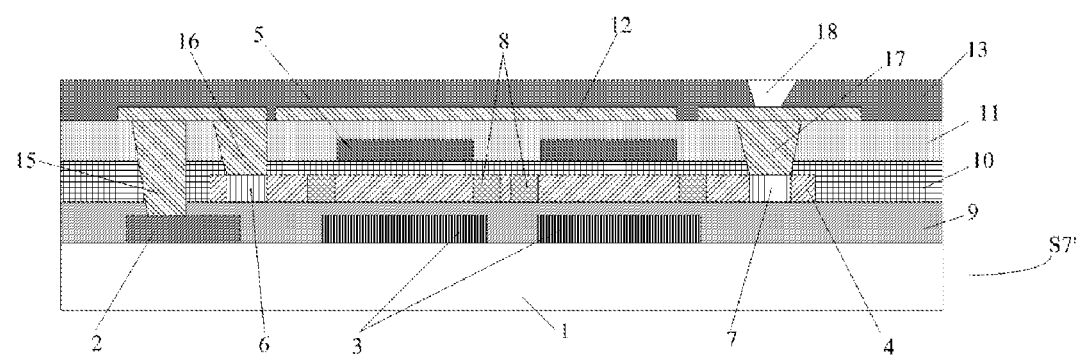

Step S7': as shown in FIG. 4g, forming the passivation layer 13 on the substrate 1 on which the step S6' is completed, and forming a pattern including a fourth via 18 in the passivation layer 13. The fourth via 18 is formed at a position corresponding to the drain electrode 7, and a position of the fourth via 18 corresponds to a position of the third via 17.

Figure 4H:
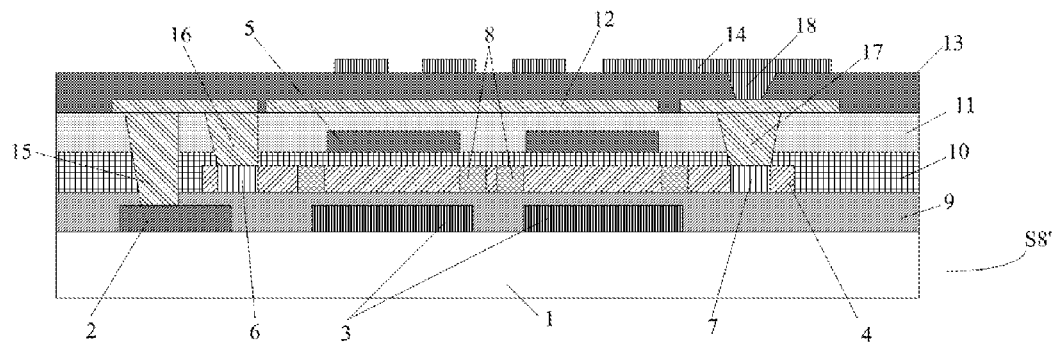

Step S8': as shown in FIG. 4h, forming a pattern including the pixel electrode 14 on the substrate 1 on which the step S7' is completed. The pixel electrode 14 and the drain electrode 7 are electrically connected via the third via 17 and the fourth via 18.

For example, the step S4 of this method may further includes the following step: forming lightly doped drains 8 in the active region 4 by way of ion implantation, the lightly doped drains 8 are formed between the source electrode 6 and the drain electrode 7 and are respectively arranged at two sides of a region corresponding to the gate electrode 5.

For example, the number of the light shielding metal layers 3 formed in the step S1 is two, and the number of the gate electrodes 5 formed in the step S3 is two. Positions where the light shielding metal layers 3 are arranged correspond to positions of the gate electrodes 5 respectively.

As a manufacturing method corresponding to a preferred structure of an array substrate, when a flat layer is formed between the intermediate dielectric layer 11 and the first electrode, a patterning process of forming a via for electrically connecting the pixel electrode 14 and the drain electrode 7 in the flat layer may be one for forming the third via 17, thus no additional process is added (i.e., a patterning process corresponds to a step P7 (see FIG. 2g) of a method for manufacturing an array substrate in the prior art will not be added).

Embodiment 2

An array substrate according to the present embodiment differs from that according to Embodiment 1 in that: the first electrode is a pixel electrode of plate shape, and the second electrode is a common electrode of slit shape. Correspondingly, in this array substrate, the gate insulating layers and the intermediate dielectric layer are provided with a third via at a position corresponding to the drain electrode, and the pixel electrode and the drain electrode are electrically connected via the third via. Based on the above difference in structure of this array substrate, there is no need to provide a fourth via in the array substrate according to the present embodiment. Other structures in the array substrate according to the present embodiment and materials thereof are the same as those in the array substrate according to Embodiment 1, and detailed description thereof is omitted.

Correspondingly, as for the above array substrate, the present embodiment provides a method for manufacturing the array substrate. The method according to the present embodiment differs from that according to Embodiment 1 in that: in correspondence with the structure of the above array substrate, the method for manufacturing an array substrate according to the present embodiment does not include a step of providing a fourth via, and the common electrode is formed above the pixel electrode.

In the present embodiment, a step of forming a pattern including a first electrode and a second electrode in the method includes:

Step S5: forming an intermediate dielectric layer and a pattern including a first via, a second via, and a third via on the substrate on which the step S4 is completed. The first via is formed at a position corresponding to the data line and penetrates through the buffer layer, the gate insulating layer, and the intermediate dielectric layer; the second via is formed at a position corresponding to the source electrode and penetrates through the gate insulating layer and the intermediate dielectric layer; and the third via is formed at a position corresponding to the drain electrode and penetrates through the gate insulating layer and the intermediate dielectric layer.

Step S6: forming a pattern including the pixel electrode on the substrate on which the step S5 is completed. The data line and the source electrode are electrically connected via the first via and the second via, and the pixel electrode and the drain electrode are electrically connected via the third via.

Step S7: forming the passivation layer and a pattern including the common electrode on the substrate on which the step S6 is completed. The passivation layer completely covers the pixel electrode, and a pattern of the common electrode is formed on the passivation layer.

The method according to the present embodiment does not include a step corresponding to the step S8'. Other steps of the method for manufacturing an array substrate according to the present embodiment are the same as those of the method according to Embodiment 1, and detailed description thereof is omitted.

In the array substrate according to the present embodiment and the method for manufacturing the same, since no fourth via is provided, the total number of patterning processes is further reduced and manufacturing efficiency of the array substrate is improved.

Embodiment 3

Figure 5:
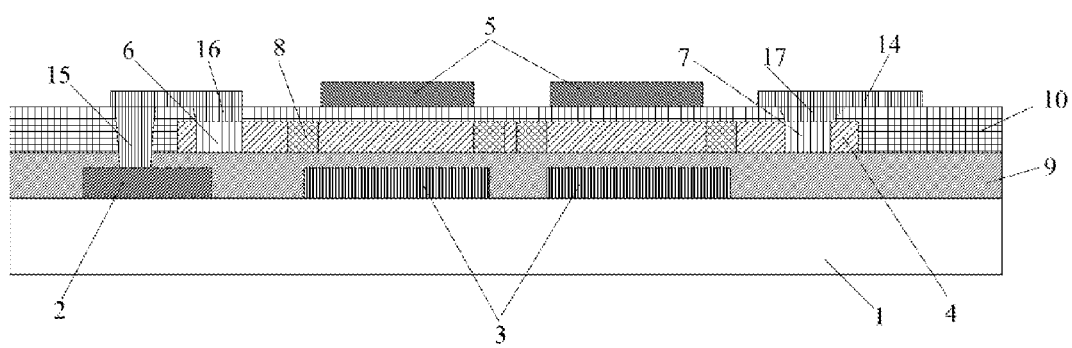
FIG. 5 is a schematic diagram showing the structure of an array substrate according to Embodiment 3 of the present invention.

The present embodiment provides an array substrate, as shown in FIG. 5. The array substrate includes a substrate 1 and data lines 2 and scan lines (not shown in FIG. 5) which are arranged on the substrate 1. The data lines 2 and the scan lines define a plurality of pixel regions, and a thin film transistor is arranged in each of the plurality of pixel regions. The thin film transistor includes a gate electrode 5, a source electrode 6, a drain electrode 7, and an active region 4. The gate electrode 5 is arranged above the active region 4. The source electrode 6 and the drain electrode 7 are arranged at two opposite sides of the active region 4 respectively. Light shielding metal layers 3 are further arranged in each of the plurality of pixel regions. The light shielding metal layers 3 and the data line 2 are arranged in the same layer on the substrate 1. The light shielding metal layers 3 are arranged under the active region 4 and at least partially overlaps with the active region 4 in an orthogonal projection direction. The data line 2 is close to the source electrode 6 and does not overlap with the active region 4 at least partially in the orthogonal projection direction.

The array substrate further includes lightly doped drains 8, a buffer layer 9, and a gate insulating layer 10.

The structures in the above array substrate and the materials thereof are the same as those in the array substrate according to Embodiment 1 or 2, and, detailed description thereof is omitted.

What different from Embodiments 1 and 2 are: the array substrate according to the present embodiment further includes a pixel electrode 14 arranged on the gate insulating layer 10. The gate insulating layer 10 is provided with a third via 17 at a position corresponding to the drain electrode 7. The pixel electrode 14 and the drain electrode 7 are electrically connected through the third via 17. The gate insulating layer 10 and the buffer layer 9 are provided with a first via 15 at a position corresponding to the data line 2, and the gate insulating layer 10 is provided with a second via 16 at a position corresponding to the source electrode 6. The data line 2 and the source electrode 6 are electrically connected through the first via 15 and the second via 16.

Figure 6A:
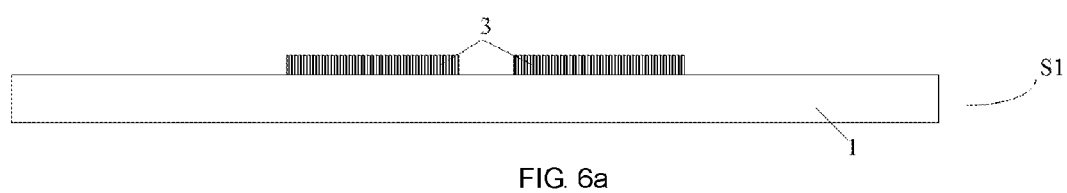
FIGS. 6a to 6f are schematic sectional views of the array substrate shown in FIG. 5 in respective steps when being manufactured.
Figure 6B:
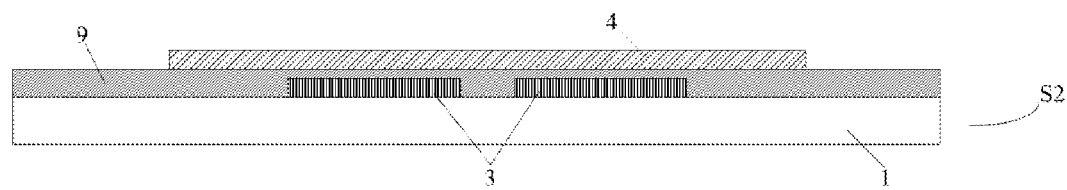
Figure 6C:
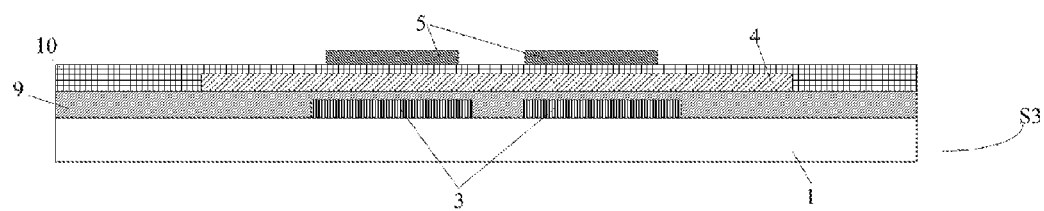
Figure 6D:
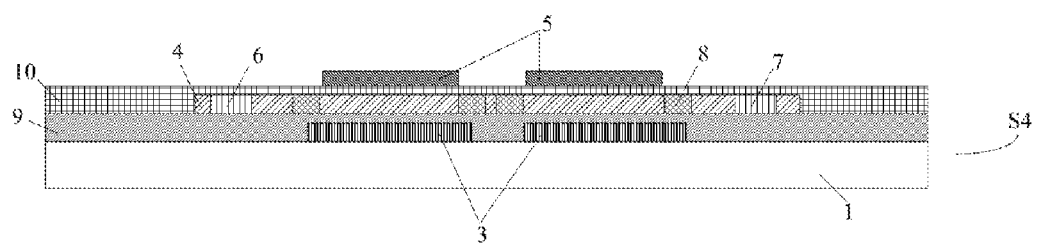
Figure 6E:
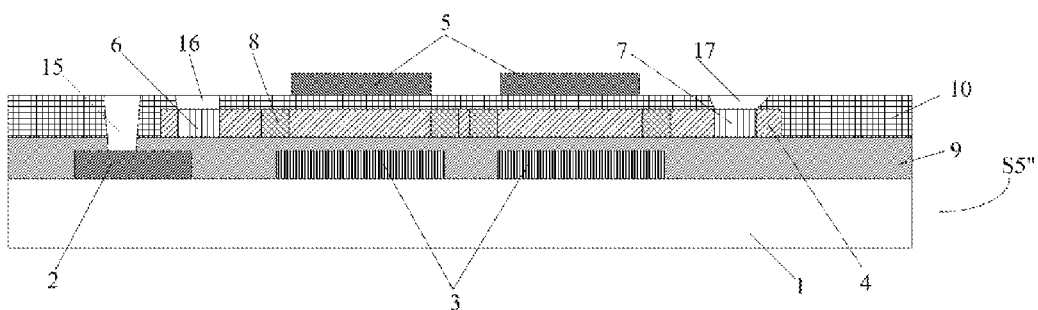
Figure 6F:
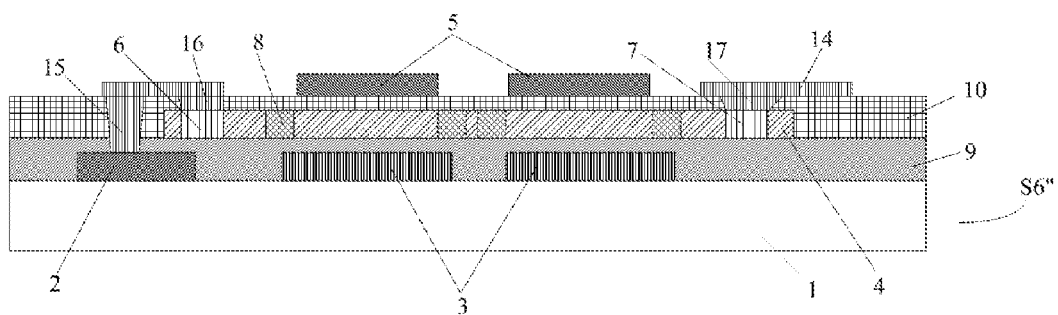

Correspondingly, as for the structure of the above array substrate, the present embodiment provides a method for manufacturing the array substrate. The first four steps (i.e., steps S1, S2, S3, and S4, as shown in FIGS. 6a to 6d) of this method are the same as the first four steps of the method for manufacturing the array substrate according to Embodiment 1 or 2. In addition, this method for manufacturing an array substrate further includes a step of forming a pixel electrode. As shown in FIGS. 6e to 6f, the step of forming a pixel electrode includes the following steps:

Step S5": as shown in FIG. 6e, forming a pattern including a first via 15, a second via 16, and a third via 17 on the substrate 1 on which the step S4 is completed. The first via 15 is formed at a position corresponding to the data line 2 and penetrates through the buffer layer 9 and the gate insulating layer 10; the second via 16 is formed at a position corresponding to the source electrode 6 and penetrates through the gate insulating layer 10; and the third via 17 is formed at a position corresponding to the drain electrode 7 and penetrates through the gate insulating layer 10.

Step S6": as shown in FIG. 6f, forming a pattern including the pixel electrode 14 on the substrate 1 on which the step S5" is completed. The data line 2 and the source electrode 6 are electrically connected through the first via 15 and the second via 16. The pixel electrode 14 and the drain electrode 7 are electrically connected through the third via 17.

It should be noted that, embodiments of the present invention are described in detailed by taking an array substrate having a display mode of advanced super dimension switch (i.e., an ADS display mode) as an example in the Embodiments 1 and 2, and embodiments of the present invention is described in detailed by taking an array substrate having a twisted nematic display mode (i.e., an TN display mode) as an example in the Embodiments 3. However, the above embodiments are only several embodiments of the present invention, and the actual scope of application of the present invention is not limited thereto.

The mode of advanced super dimension switch (ADS) is a core technology of plane electric field wide viewing angle, and the key technology features thereof are described below: a multi-dimension electric field is formed by an electric field generated at the edges of slit electrodes in the same plane and an electric field generated between a slit electrode layer and a plate electrode layer; thus the liquid crystal molecules in all orientations between the slit electrodes and right above the electrodes within a liquid crystal cell are able to rotate, thereby the operating efficiency of the liquid crystal is improved and a light-transmission efficiency is increased. A switch technology of ADS mode can improve the image quality of a TFT-LCD product which has advantages of high resolution, high transmittance, low power consumption, wide viewing angle, high aperture ratio, low chromatic aberation, no push Mura, and the like. Improved technologies of the ADS technology for different applications include a high transmittance technology (I-ADS), a high aperture ratio technology (H-ADS), a high resolution technology (S-ADS), and the like.

Figure 1:
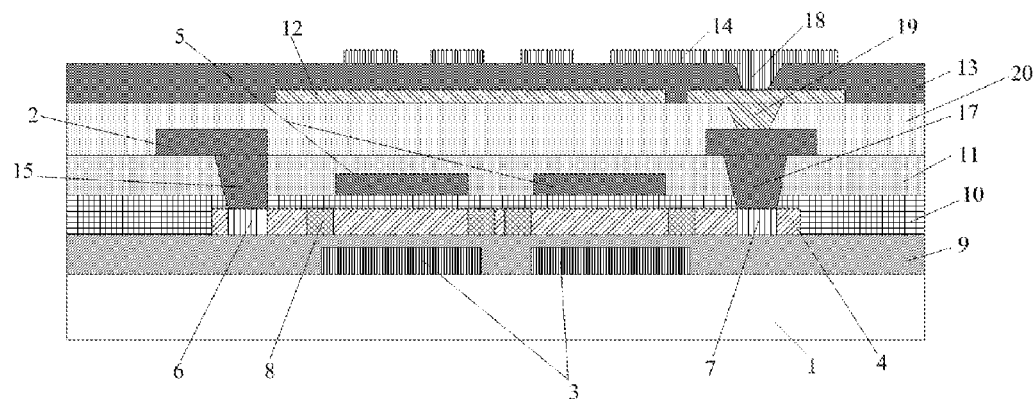
FIG. 1 is a schematic diagram showing the structure of an array substrate in the prior art.
Figure 2A:
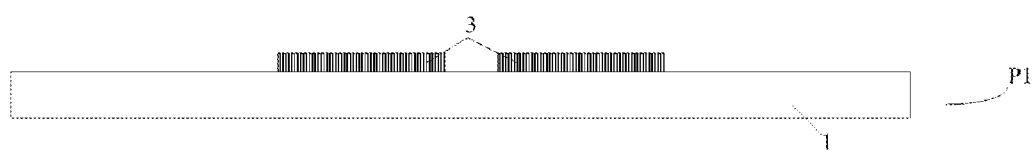
FIGS. 2a to 2j are schematic sectional views of array substrates manufactured in respective steps provided by the prior art.
Figure 2B:
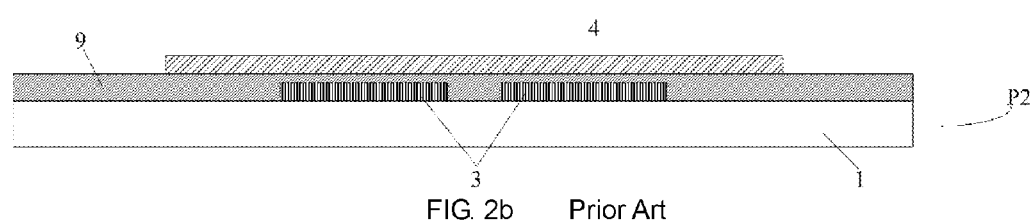
Figure 2C:
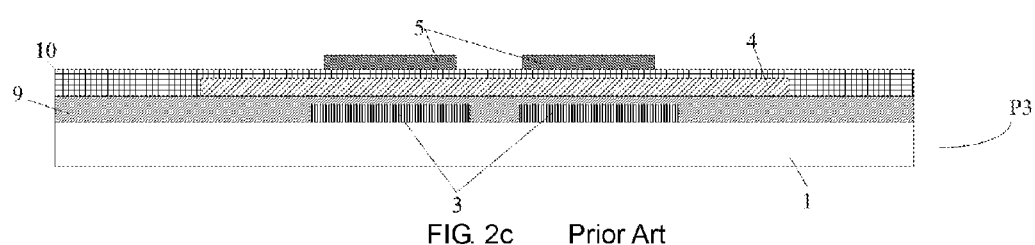
Figure 2D:
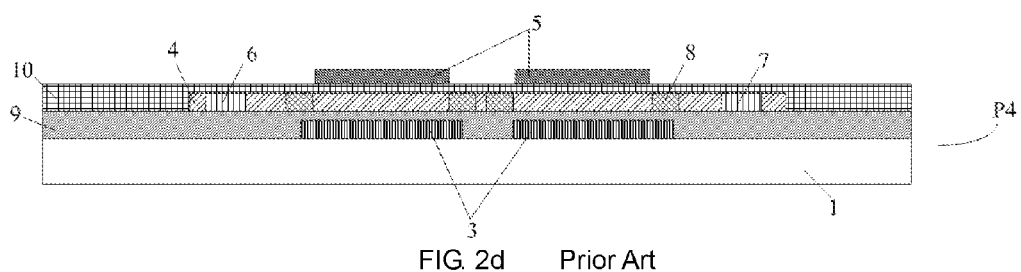
Figure 2E:
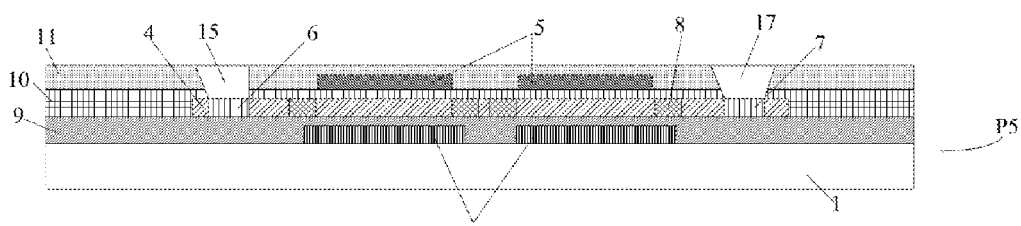
Figure 2F:
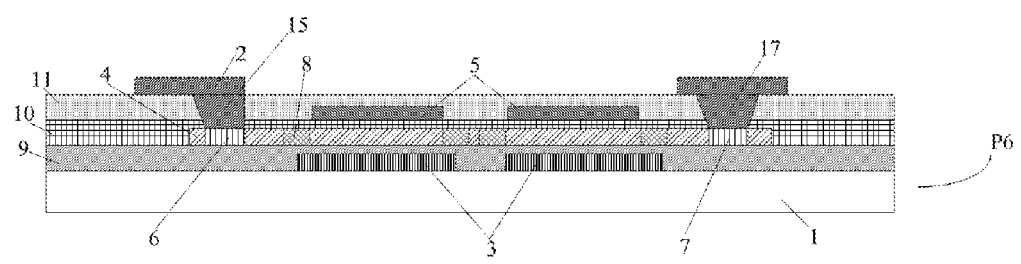
Figure 2G:
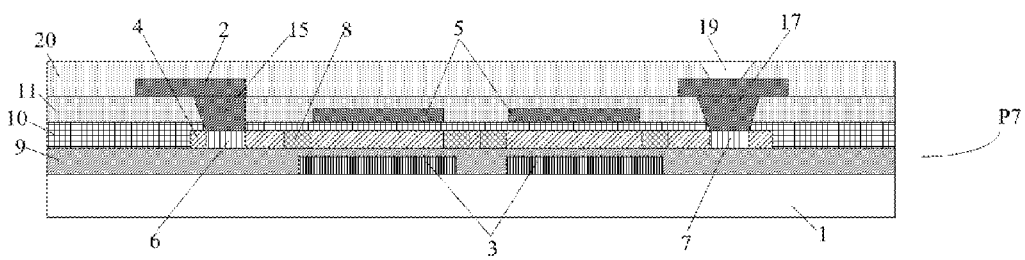
Figure 2H:
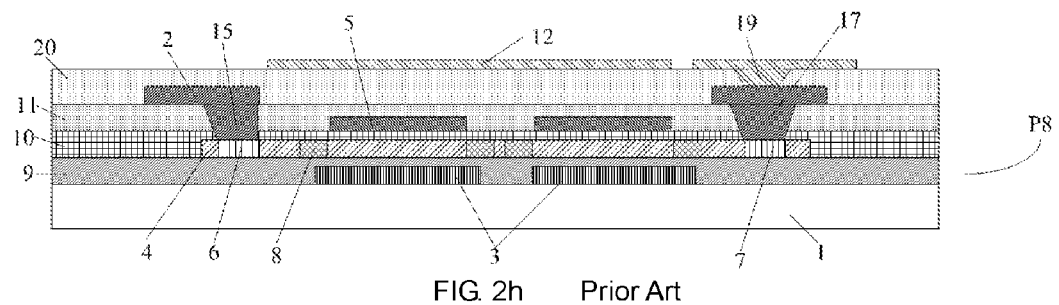
Figure 2I:
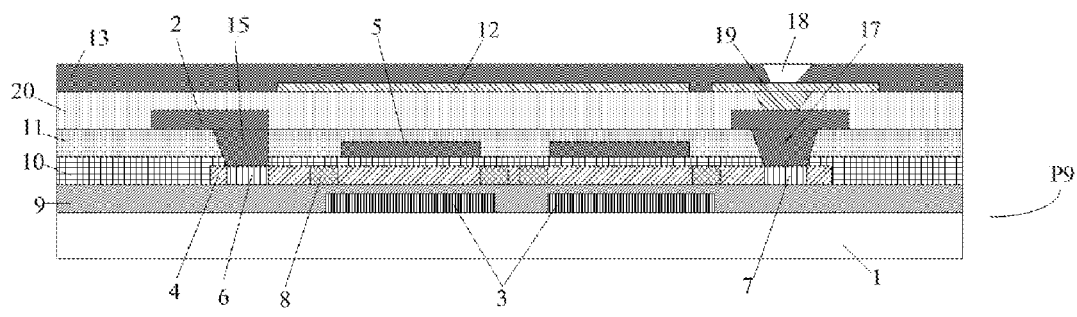
Figure 2J:
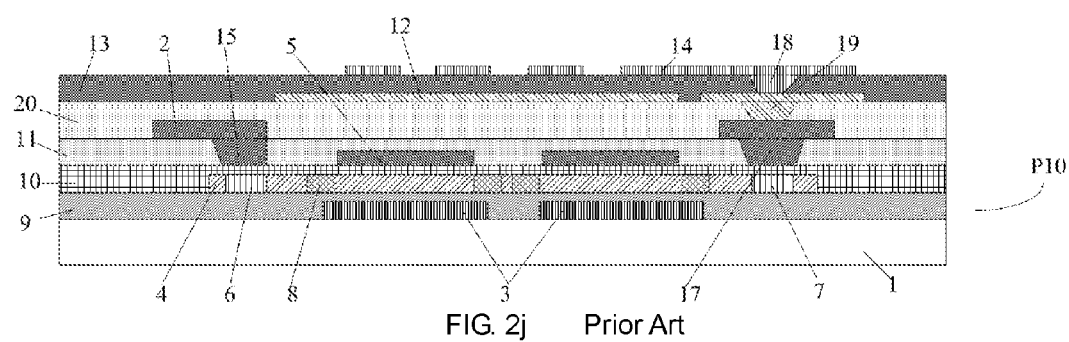

The advantageous effects of the present embodiment are as follows: in the array substrates according to the present embodiments, the light shielding metal layers and the data line are formed in the same layer on the array substrate; and in the corresponding methods for manufacturing the array substrates, the light shielding metal layers and the data line are formed by a single patterning process (including an exposure process). Compared with the fact that the light shielding metal layers and a data line are not formed by a single patterning process in an existing array substrate and they are not arranged in the same layer of the array substrate, a separate patterning process for a data line is omitted (i.e., a patterning process corresponding to the step P6 (as shown in FIG. 2*f*) of the method for manufacturing an array substrate in the prior art is omitted). Thus, the number of patterning processes for the array substrate is reduced and the manufacturing efficiencies of the array substrate and the display device are increased.

Embodiment 4

The present embodiment provides a display device including the array substrate according to any one of the above embodiments.

Since the display device includes the array substrate according to any one of the above embodiments, the number of patterning processes for the array substrate is reduced and the manufacturing efficiency of the display device are increased.

The display device may be any product or component having a display function, such as a liquid crystal panel, an electronic paper, an OLED panel, a mobile phone, a tablet computer, a television set, a monitor, a laptop computer, a digital photo frame, a navigator, or the like.

It should be understood that, the foregoing embodiments are only exemplary embodiments used to explain the principle of the present invention, and the present invention is not limited thereto. Variations and improvements easily conceived by a person having ordinary skill in the art without departing from the spirit and essence of the present invention all fall within the protection scope of the present invention.

What is claimed is:

1. A method for manufacturing an array substrate including a step of forming data lines, scan lines, and a light shielding metal layer on a substrate and a step of forming thin film transistors on the substrate, forming the thin film transistor includes a step of forming a gate electrode, a source electrode, a drain electrode, and an active region, both the thin film transistors and the light shielding metal layer are formed in a plurality of pixel regions defined by the scan lines and the data lines, wherein the light shielding metal layer and the data lines are formed along a direction parallel to a surface of the substrate in a same layer on the substrate in a single step, and are arranged with an interval therebetween on the substrate, the data lines being arranged under the active region, the light shielding metal layer is formed under the active region and at least partially overlaps with the active region in a projection direction, the data line is close to the source electrode and does not overlap with the active region at least partially in the projection direction.

2. The method for manufacturing an array substrate according to claim 1, wherein, the step of forming a data line, a scan line, and a light shielding metal layer on a substrate includes:

forming a pattern including the data lines and the light shielding metal layer simultaneously on the substrate by a single patterning process, the data lines and the light shielding metal layer being arranged apart;

the step of forming a thin film transistor includes:

forming a buffer layer and a pattern including the active region on the substrate on which the data lines and the light shielding metal layer are formed, the buffer layer covers the light shielding metal layer and the data lines, a pattern of the active region is formed on the buffer layer and at least partially overlaps with the light shielding metal layer in the project direction;

forming a gate insulating layer and a pattern including the gate electrode on the substrate, a pattern of the gate electrode is formed at a position on the gate insulating layer corresponding to a position of the light shielding metal layer; and forming the source electrode and the drain electrode on the substrate, the source electrode and the drain electrode are formed at two opposite sides of the active region by way of ion implantation.

3. The method for manufacturing an array substrate according to claim 2, wherein the method further includes a step of forming a pattern including a first electrode and a second electrode, the first electrode is a pixel electrode, the second electrode is a common electrode, the step of forming a pattern including a first electrode and a second electrode includes:

forming an intermediate dielectric layer and a pattern including a first via, a second via, and a third via on the substrate, wherein the first via is formed at a position corresponding to the data line and penetrates through the buffer layer, the gate insulating layer, and the intermediate dielectric layer, the second via is formed at a position corresponding to the source electrode and penetrates through the gate insulating layer and the intermediate dielectric layer, and the third via is formed at a position corresponding to the drain electrode and penetrates through the gate insulating layer and the intermediate dielectric layer;

forming a pattern including the pixel electrode on the substrate, the data line and the source electrode are electrically connected through the first via and the second via, the pixel electrode and the drain electrode are electrically connected through the third via; and forming the passivation layer and a pattern including the common electrode on the substrate, the passivation layer completely covers the pixel electrode, the pattern including the common electrode is formed on the passivation layer.

4. The method for manufacturing an array substrate according to claim 2, wherein the method further includes a step of forming a pattern including a first electrode and a second electrode, the first electrode is a common electrode, the second electrode is a pixel electrode, the step of forming a pattern including a first electrode and a second electrode includes:

forming an intermediate dielectric layer and a pattern including a first via, a second via, and a third via on the substrate, wherein the first via is formed at a position corresponding to the data line and penetrates through the buffer layer, the gate insulating layer, and the intermediate dielectric layer, the second via is formed at a position corresponding to the source electrode and penetrates through the gate insulating layer and the intermediate dielectric layer, and the third via is formed at a position corresponding to the drain electrode and penetrates through the gate insulating layer and the intermediate dielectric layer;

forming a pattern including the common electrode on the substrate, the data line and the source electrode are electrically connected through the first via and the second via, an electrically conductive material used to form the common electrode is also filled into the third via;

forming the passivation layer on the substrate and forming a pattern including a fourth via in the passivation layer, the fourth via is formed at a position corresponding to the drain electrode, and a position of the fourth via corresponds to a position of the third via; and forming a pattern including the pixel electrode on the substrate, the pixel electrode and the drain electrode are electrically connected via the third via and the fourth via.

5. The method for manufacturing an array substrate according to claim 2, wherein the method further includes a step of forming a pixel electrode;

forming a pattern including a first via, a second via, and a third via on the substrate, wherein the first via is formed at a position corresponding to the data line and penetrates through the buffer layer and the gate insulating layer, the second via is formed at a position corresponding to the source electrode and penetrates through the gate insulating layer, and the third via is formed at a position corresponding to the drain electrode and penetrates through the gate insulating layer; and forming a pattern including the pixel electrode on the substrate, the data line and the source electrode are electrically connected through the first via and the second via, the pixel electrode and the drain electrode are electrically connected through the third via.

6. The method for manufacturing an array substrate according to claim 2, wherein the step of forming the source electrode and the drain electrode further includes: forming lightly doped drains in the active region by way of ion implantation, the lightly doped drains are formed between the source electrode and the drain electrode and are respectively arranged at two sides of a region corresponding to the gate electrode.

7. The method for manufacturing an array substrate according to claim 6, wherein positions of the light shielding metal layers are arranged to correspond to positions of the gate electrodes respectively.

\* \* \* \* \*